United States Patent
Oikawa et al.

(10) Patent No.: US 7,154,766 B2
(45) Date of Patent: Dec. 26, 2006

(54) FERROELECTRIC MEMORY

(75) Inventors: Kohei Oikawa, Kamakura (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 10/934,358

(22) Filed: Sep. 7, 2004

(65) Prior Publication Data
US 2006/0018144 A1    Jan. 26, 2006

(30) Foreign Application Priority Data
Jul. 20, 2004    (JP)    ............................. 2004-212176

(51) Int. Cl.
*G11C 11/22*    (2006.01)
*G11C 11/42*    (2006.01)
*G11C 7/00*    (2006.01)
*G11C 7/02*    (2006.01)
*G11C 8/00*    (2006.01)
*G11C 8/18*    (2006.01)

(52) U.S. Cl. ...................... 365/145; 365/65; 365/191; 365/207; 365/230.03; 365/230.06; 365/233.5

(58) Field of Classification Search ................ 365/145
See application file for complete search history.

(56) References Cited

U.S. PATENT DOCUMENTS

| 5,545,977 | A | * | 8/1996 | Yamada et al. .............. 323/313 |
|---|---|---|---|---|
| 5,903,492 | A | | 5/1999 | Takashima |
| 6,434,736 | B1 | * | 8/2002 | Schaecher et al. ............ 716/17 |
| 6,930,908 | B1 | * | 8/2005 | Hoya et al. ................. 365/145 |
| 2002/0034091 | A1 | * | 3/2002 | Miyakawa et al. ......... 365/145 |
| 2003/0099133 | A1 | * | 5/2003 | Won et al. ............. 365/185.21 |
| 2003/0237011 | A1 | * | 12/2003 | Jacob ......................... 713/322 |
| 2004/0105293 | A1 | * | 6/2004 | Jacob et al. ................ 365/145 |
| 2004/0125642 | A1 | * | 7/2004 | Oikawa et al. ............. 365/145 |
| 2004/0166629 | A1 | * | 8/2004 | Hilliger et al. ............. 438/253 |
| 2005/0013156 | A1 | * | 1/2005 | Hoya et al. ................. 365/145 |
| 2005/0068843 | A1 | * | 3/2005 | Takeuchi ................. 365/233.5 |
| 2005/0172177 | A1 | * | 8/2005 | Oikawa ....................... 714/52 |
| 2005/0270886 | A1 | * | 12/2005 | Takashima .................. 365/232 |

* cited by examiner

*Primary Examiner*—Amir Zarabian
*Assistant Examiner*—Ly Duy Pham
(74) *Attorney, Agent, or Firm*—Oblon, Spivak, McClelland, Maier & Neustadt, P.C.

(57) ABSTRACT

An aspect of the present invention provides a ferroelectric memory comprising a cell block having a plurality of unit cells connected in series, one end of the cell block being connected to a plate line and the other end of the cell block being connected to a bit line through a block selecting transistor, a sense amplifier connected to the bit line, and a block selector decoder which controls ON/OFF of the block selecting transistor. The timing for operating the sense amplifier and block selector decoder is changed corresponding to a position of a selected unit cell objective for data read of the plurality of unit cells.

18 Claims, 11 Drawing Sheets

FERROELECTRIC MEMORY

CROSS-REFERENCE TO RELATED APPLICATIONS

This application is based upon and claims the benefit of priority from prior Japanese Patent Application No. 2004-212176, field Jul. 20, 2004, the entire contents of which are incorporated herein by reference.

BACKGROUND OF THE INVENTION

1. Field of the Invention

The present invention relates to a ferroelectric memory which stores data in an involatile manner by using a ferroelectric capacitor, and more particularly to a series connected TC unit type ferroelectric RAM in which a cell block is constituted by connecting plural units cells each comprised of a ferroelectric capacitor and a cell transistor connected in parallel, in series.

2. Description of the Related Art

The ferroelectric memory has a feature in that it stores data in an involatile manner by using a ferroelectric capacitor. As a cell array of the ferroelectric memory, there have been various types well known and one of them is series-connected TC unit type (see, for example, Jpn. Pat. Appln. KOKAI Publication No. 10-255483).

Figure 1:
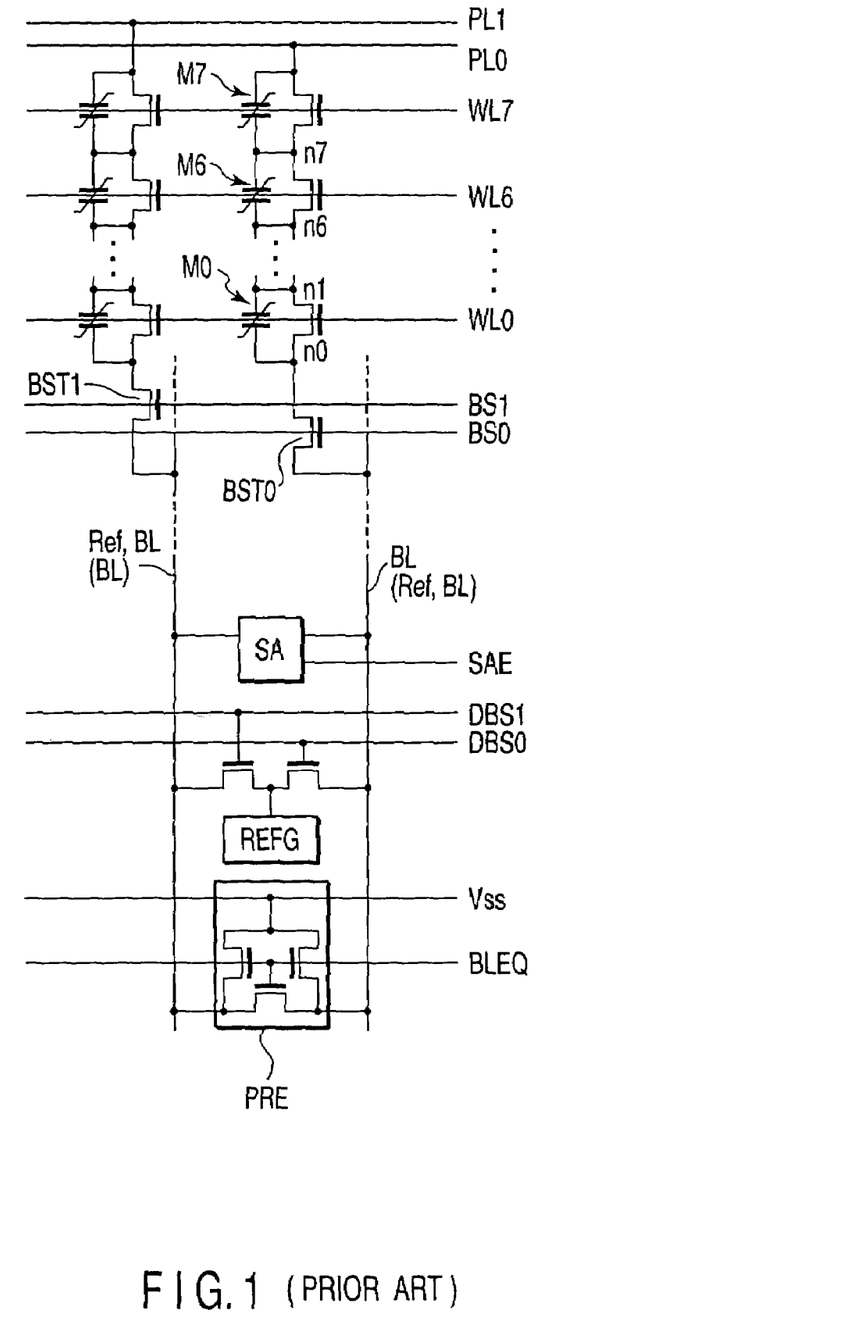
FIG. 1 is a circuit diagram showing a cell array of a conventional ferroelectric memory.

A memory cell array of the series connected TC unit ferroelectric RAM has, for example, the structure shown in FIG. 1. The basic operation timing of such a memory cell array at the data read is as shown in FIG. 2.

Problems of the series connected TC unit type ferroelectric RAM will be described below.

Figure 2:
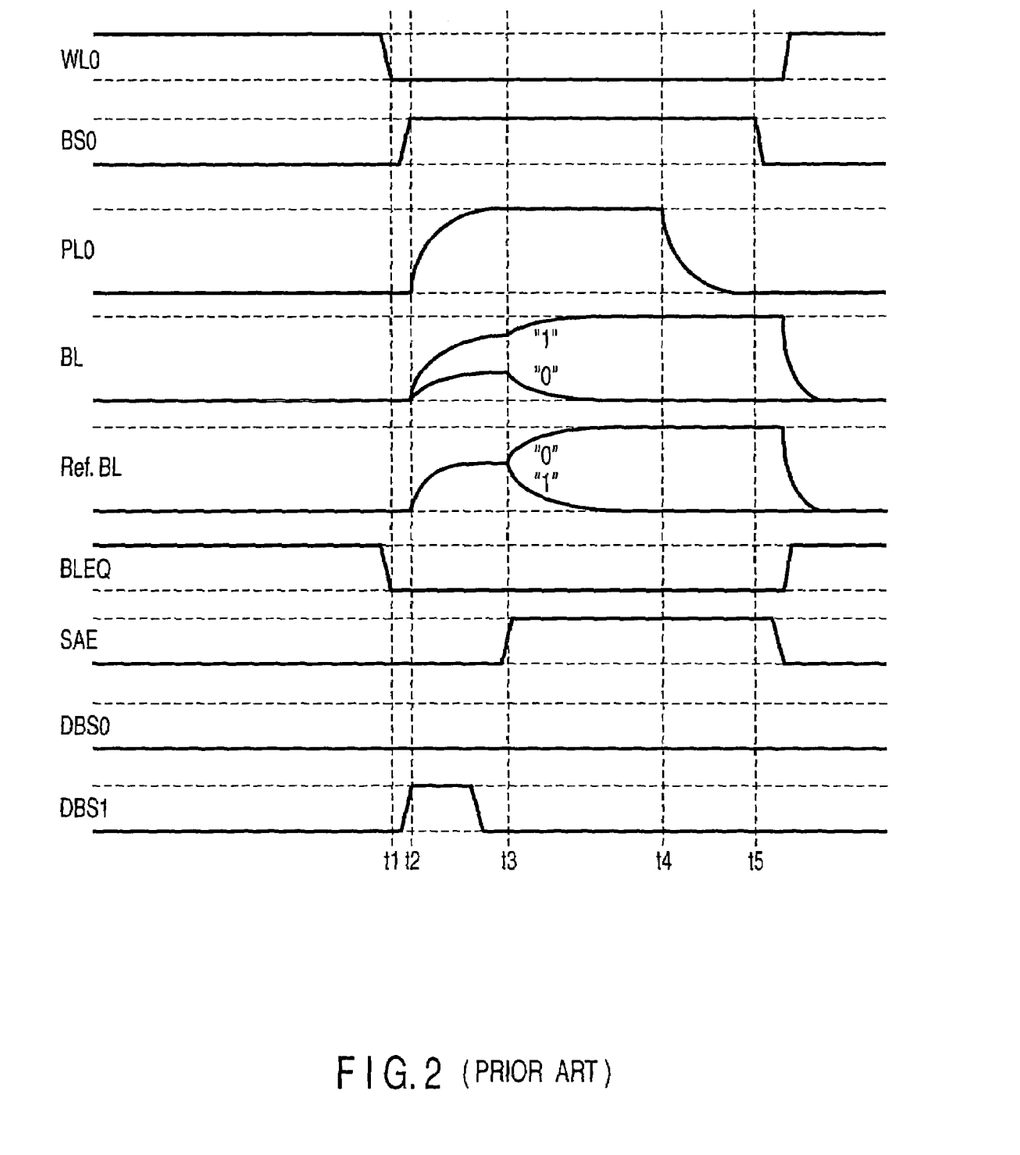
FIG. 2 is a waveform diagram showing the operation of the conventional ferroelectric memory.
Figure 3:
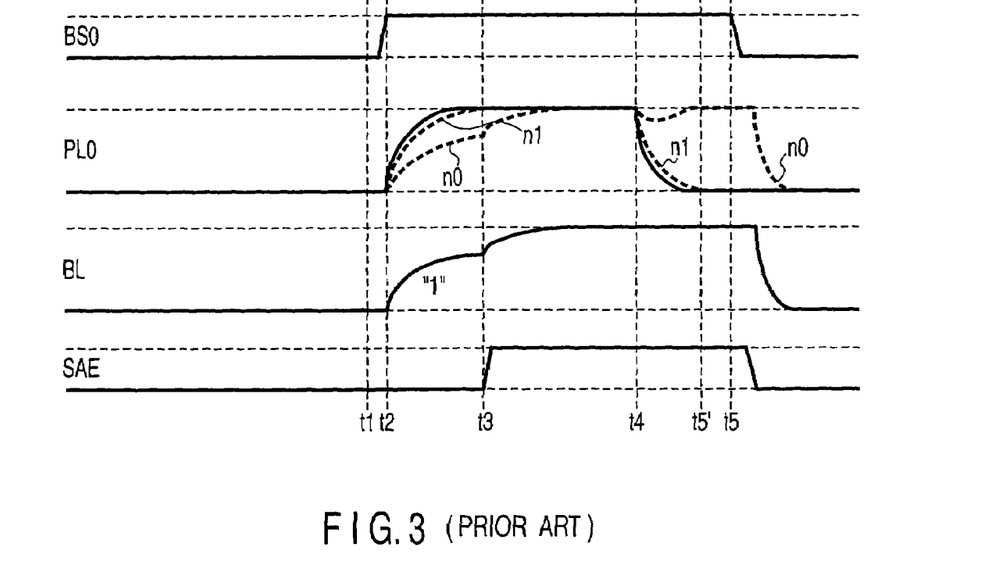
FIG. 3 is a waveform diagram showing the operation of the conventional ferroelectric memory.
Figure 4:
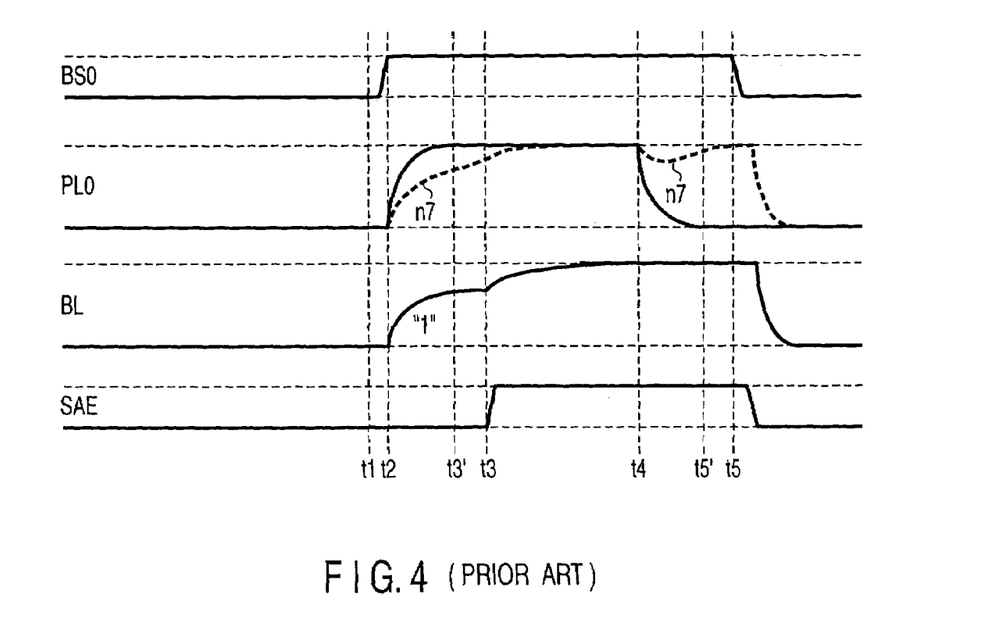
FIG. 4 is a waveform diagram showing the operation of the conventional ferroelectric memory.

FIGS. 3 and 4 show a condition in which read data is "1" in the waveform diagram of FIG. 2, in detail.

FIG. 3 shows a condition in which a word line WL0 in FIG. 1 is selected so that read data "1" is read from a unit cell MO. FIG. 4 shows a condition in which a word line WL7 in FIG. 1 is selected so that read data "1" is read from a unit cell M7.

In FIGS. 3 and 4, the dotted lines expressed with n0, n1 and n7 indicate changes in potential of the nodes n0, n1 and n7 in the ferroelectric memory in FIG. 1.

For data read to the unit cells M0, M7, for example, a plate line PL0 is set to "H" and accompanied by this, the potential of a bit line BL is raised up to a value corresponding to the read data "1". Thereafter, the potential of the bit line BL and the potential of a reference bit line Ref.BL are compared to each other with a sense amplifier SA.

If the word line WL0 is selected, time t2 to t3 in which the plate line PL0 is changed from "L" to "H" is longer than a case where the word line WL7 is selected.

When the word line WL0 is selected, parasitic capacity and parasitic resistance generated in the nodes n1, n2, ... n7 within the unit cell are connected to the plate line PL0. Because all these parasitic capacity and parasitic resistance need to be charged to charge the plate line PL0, time t2 to t3 in which the plate line PL0 is turned from "L" to "H" is expanded.

On the other hand, to rewrite "1" data into the unit cells M0, M7, the plate line PL0 is turned to "L" so as to apply a predetermined voltage to the unit cell.

If the word line WL7 is selected, changing of the plate line PL0 from "H" to "L" is terminated in a relatively short time. Time t4 to t5 for charging the node n7 to the potential "H" of the bit line BL, that is, time for rewriting of the "1" data is longer than a case where the word line WL0 is selected.

As for the reason, if the word line WL7 is selected, the parasitic capacity and parasitic resistance generated in the nodes n0, n1, ... n6 within the unit cell are connected to the node n7 in the unit cell. Because all the parasitic capacities and parasitic resistances need to be charged in order to discharge the plate line PL0 and rewrite the "1" data, the time t4 to t5 necessary for rewriting of the "1" data prolongs.

In this manner, in the series connected TC unit type ferroelectric RAM, time until the plate line is turned to "H" and time necessary for rewriting of the "1" data differ depending on a position of a selected cell unit (word line).

Because according to the conventional data read system, the control timing of the data read is determined presuming the worst case corresponding to such a situation, necessarily the cycle time prolongs, which is a problem to be solved.

For example, if considering the case shown in FIG. 3, when the word line WL0 is selected, the rewriting of the "1" data can be terminated at time t5'. However, a period for rewriting of the "1" data is secured until the time t5 considering the worse case, that is, a case where the word line WL7 is selected.

Further, if considering the case shown in FIG. 4, when the word line WL7 is selected, the plate line can be turned to "H" at time t3'. However, a period for turning the plate line to "H" is secured until time t3 considering a case where the word line WL0 is selected.

BRIEF SUMMARY OF THE INVENTION

According to an aspect of the present invention, there is provided a ferroelectric memory comprising: a cell block having a plurality of unit cells connected in series, an end of the cell block being connected to a plate line and the other end of the cell block being connected to a bit line through a block selecting transistor; a sense amplifier connected to the bit line; a block selector decoder which controls ON/OFF of the block selecting transistor; and an enable signal generating circuit which controls a timing for operating the sense amplifier and the block selector decoder, wherein each of the plurality of unit cells has a structure in which a ferroelectric capacitor and a cell transistor are connected in parallel, and the enable signal generating circuit changes the timing for operating the sense amplifier and the block selector decoder depending on a position of a selected unit cell objective for data read of the plurality of unit cells.

DETAILED DESCRIPTION OF THE INVENTION

A ferroelectric memory of an aspect of the present invention will be described below in detail with reference to the accompanying drawing.

1. Outline

An aspect of the present invention concerns a series connected TC unit type ferroelectric RAM in which a cell block is constituted by connecting unit cells comprised of a ferroelectric capacitor and a cell transistor, these components being connected in parallel, in plural quantities in series.

In such a series connected TC unit type ferroelectric RAM, the control timing of data read is changed depending on a position of a unit cell to be accessed at the time of data read, more specifically, the position of the unit cell within a cell block.

For example, the data read timing is controlled so that the nearer a bit line the cell unit is disposed, the shorter a period necessary for rewriting "1" data is. Further, the data read timing is controlled so that the nearer a plate line the unit cell is disposed, the shorter the period for turning the plate line into "H" is.

The control on the period for turning the plate line to "H" can be carried out by controlling a timing for driving a sense amplifier.

According to the present invention, by complementarily changing the period for turning the plate line to "H" and the period for rewriting "1" data depending on the position of the unit cell, entirely, the cycle time is reduced.

2. Reference Example

Prior to description of the embodiments of the present invention, general control timing at the time of data read will be described with reference to FIG. 2. It is assumed that the memory cell array has the structure shown in FIG. 1.

Prior to data read, that is, in a period on the left side to time t1 (initial state), all word lines WL0, WL1, . . . WL7 are set to "H" and block selection signals BS0, BS1 are set to "L" while the plate lines PL0, PL1 are set to "L" also.

Because at this time, a bit line equalization signal BLEQ is set to "H", the bit line BL and reference bit line Ref.BL are pre-charged (equalized) to "L". Because control signals DBS0, DBS1 are set to "L", a reference potential generating circuit REFG is electrically separated from the bit line BL and the reference bit line Ref.BL.

When a memory access starts, first, the selected word line WL0 changes to "L" at time t1 and at the same time, the bit line equalization signal BLEQ changes to "L". When the bit line equalization signal BLEQ turns to "L", the pre-charge (equalization) of the bit line BL and the reference bit line Ref.BL is released.

Thereafter, the block selection signal BS0 of the selected cell block turns to "H" and the control signal DBS1 turns to "H" in time period of t1 to t2.

Consequently, the bit line BL is electrically connected to the selected cell block in the time period of t2 to t3 and changes to a potential depending on data stored in the selected unit cell. Almost at the same time, the reference bit line Ref.BL is set to a reference potential by the reference potential generating circuit REFG. Further, the plate line PL0 changes from. "L" to "H".

If, at time t3, a sense amplifier enable signal SAE is turned to "H" to drive the sense amplifier SA, a difference between the potential of the bit line BL and the potential of the reference bit line Ref.BL is amplified by the sense amplifier SA.

For example, when the potential of the bit line BL is lower than the potential of the reference bit line Ref.BL, the difference is amplified, so that the bit line BL changes to "L" (="0") and the reference bit line Ref.BL changes to "H" (="1").

Further, when the potential of the bit line BL is higher than the potential of the reference bit line Ref.BL, the difference is amplified so that the bit line BL changes to "H" (="1") and the reference bit line Ref.BL changes to "L" (="0").

The data read system in the ferroelectric memory is a destruction read system in which data in a unit cell objective for data read is destroyed.

When data of the selected unit cell is "0" in the time period of t3 to t4, rewriting of the "0" data to a selected unit cell is carried out in this period by using the fact that the plate line PL0 is in the state of "H" and the bit line BL is in the state of "L".

Thereafter, at time t4, the plate line PL0 is changed to "L" and rewriting of "1" data is carried out in correspondence to the case where data of the selected unit cell is "1".

That is, when data of the selected unit cell is "1", the plate line PL0 changes to "L" while the bit line BL changes to "H" in the time period of t4 to t5. Thus, when data of the selected unit cell is "1", rewriting of the "1" data can be executed in this period.

Finally, the levels of all the signal lines are returned to the initial condition, that is, the same condition as the period of left side to time t1 and then, data read is terminated.

3. Embodiments

Hereinafter, plural optimum embodiments of the ferroelectric memory according to the present invention will be described.

(1) First Embodiment

<1> Memory Cell Array

Figure 5:
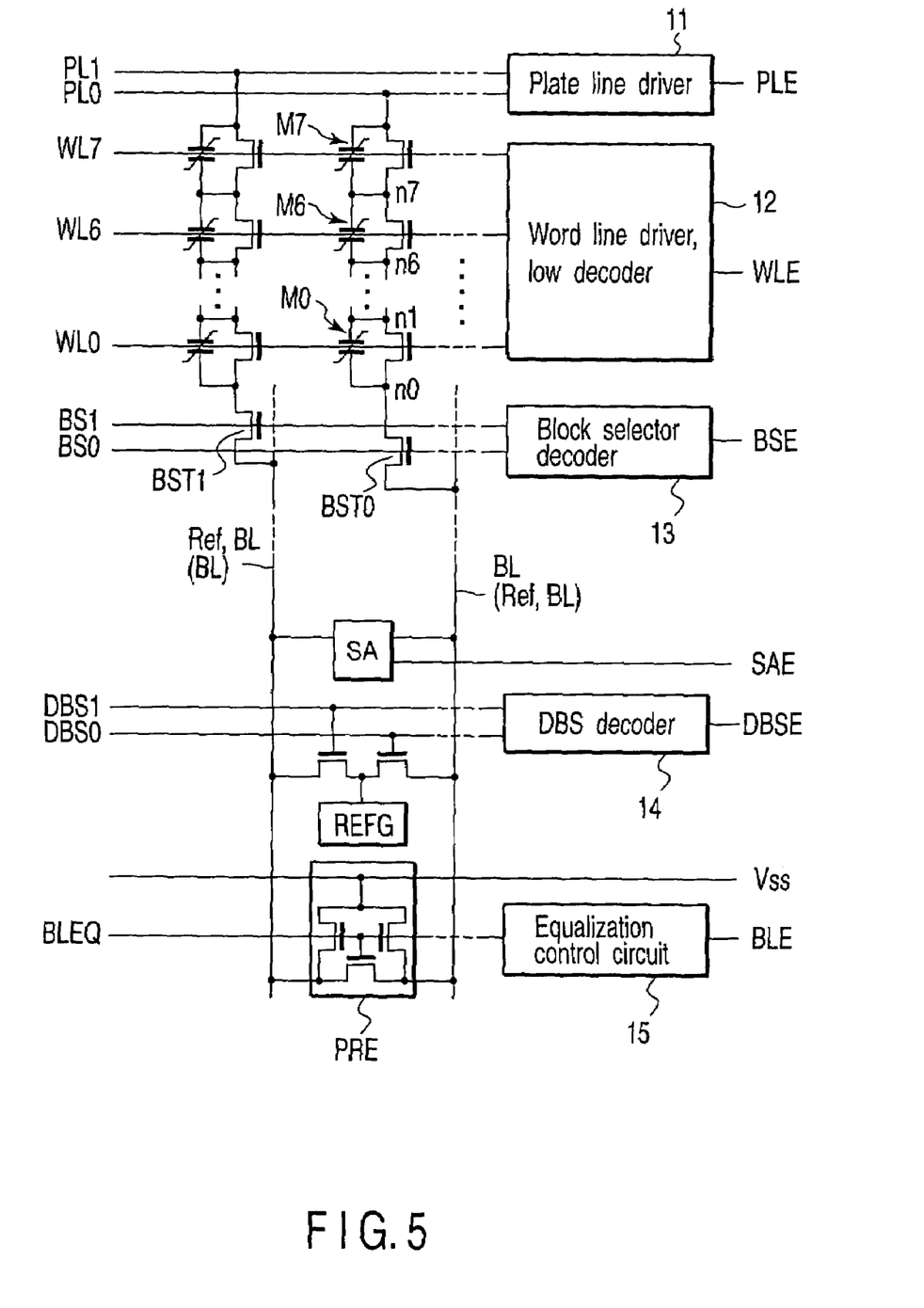
FIG. 5 is a circuit diagram showing a cell array of a ferroelectric memory according to an embodiment of the present invention.

FIG. 5 shows an example of the structure of a cell array of a series connected TC unit type ferroelectric RAM.

A unit cell is constituted of a cell transistor (T) and a ferroelectric capacitor (C). Since the ferroelectric capacitor is connected between a source and a drain of the cell transistor, the cell transistor and ferroelectric capacitor are connected in parallel.

Connecting the unit cells in plural quantities (eight in this example) in series constructs a cell block. One end of the cell block is connected to the plate lines PL0, PL1 while the other end thereof is connected to the bit line BL or the reference bit line Ref.BL through block selecting transistors BST0, BST1.

A plate line driver 11 is connected to the plate lines PL0, PL1 so as to drive the plate lines PL0, PL1. The operation of the plate line driver 11 is controlled according to a plate line driver/enable signal PLE, so that if the plate line driver/enable signal PLE turns to the enable condition (for example, "H"), the plate line driver 11 is activated.

A word line driver/low decoder 12 is connected to the word lines WL1, WL2, . . . WL7 so as to drive the word lines WL1, WL2, . . . WL7. The operation of the word line driver/low decoder 12 is controlled by a word line driver/low decoder/enable signal WLE, so that if the word lien driver/low decoder/enable signal WLE turns to enable condition (for example "H"), the word line driver/low decoder 12 turns the selected word line WLi (selected) to "H".

A block selector decoder 13 is connected to the block selecting lines BS0, BS1 so as to drive the block selecting lines BS0, BS1. The operation of the block selector decoder 13 is controlled according to the block selector decoder/enable signal BSE, so that if the block selector decoder/enable signal BSE turns to the enable condition (for example, "H"), the block selector decoder 13 is activated.

The sense amplifier SA for detecting read data is connected between the bit line BL and the reference bit line Ref.BL. When the sense amplification enable signal SAE turns into the enable condition (for example, "H"), the sense amplifier SA is activated.

The pre-charge circuit PRE for pre-charging the bit line BL and the reference bit line Ref.BL to a predetermined potential (for example, Vss) is comprised of three N-channel MOS transistors. When the bit line equalization signal BLEQ turns into the enable condition (for example, "H"), the bit line BL and the reference bit line Ref.BL are pre-charged (equalized) to a predetermined potential.

An equalization control circuit 15 outputs the bit line equalization signal BLEQ. The operation of the equalization control circuit 15 is controlled by the bit line/enable signal BLE and if the bit line/enable signal BLE turns into the enable condition (for example, "H"), the bit line equalization signal BLEQ turns into the disable condition (for example, "L").

The reference potential generating circuit REFG gives a reference potential to the reference bit line Ref.BL.

For example, when the block selecting signal BS0 is "H" and the block selecting signal BS1 is "L", the control signal DBS0 turns to "L" and the control signal DBS1 turns to "H", so that the reference potential is supplied to the reference bit line Ref.BL. Further, when the block selecting signal BS0 is "L" and the block selecting signal BS1 is "H", the control signal DBS0 turns to "H" and the control signal DBS1 turns to "L", so that the reference potential is supplied to the reference bit line (Ref.BL).

The DBS decoder 14 outputs the control signals DBS0, DBS1. The operation of the DBS decoder 14 is controlled with the DBS decoder/enable signal DBSE and if the DBS decoder/enable signal DBSE turns to the enable condition (for example, "H"), the DBS decoder 14 is activated.

<2> Enable Signal Circuit

Next, an enable signal generating circuit as a control circuit for controlling the timing at the time of data read according to the present invention will be described.

Figure 6:
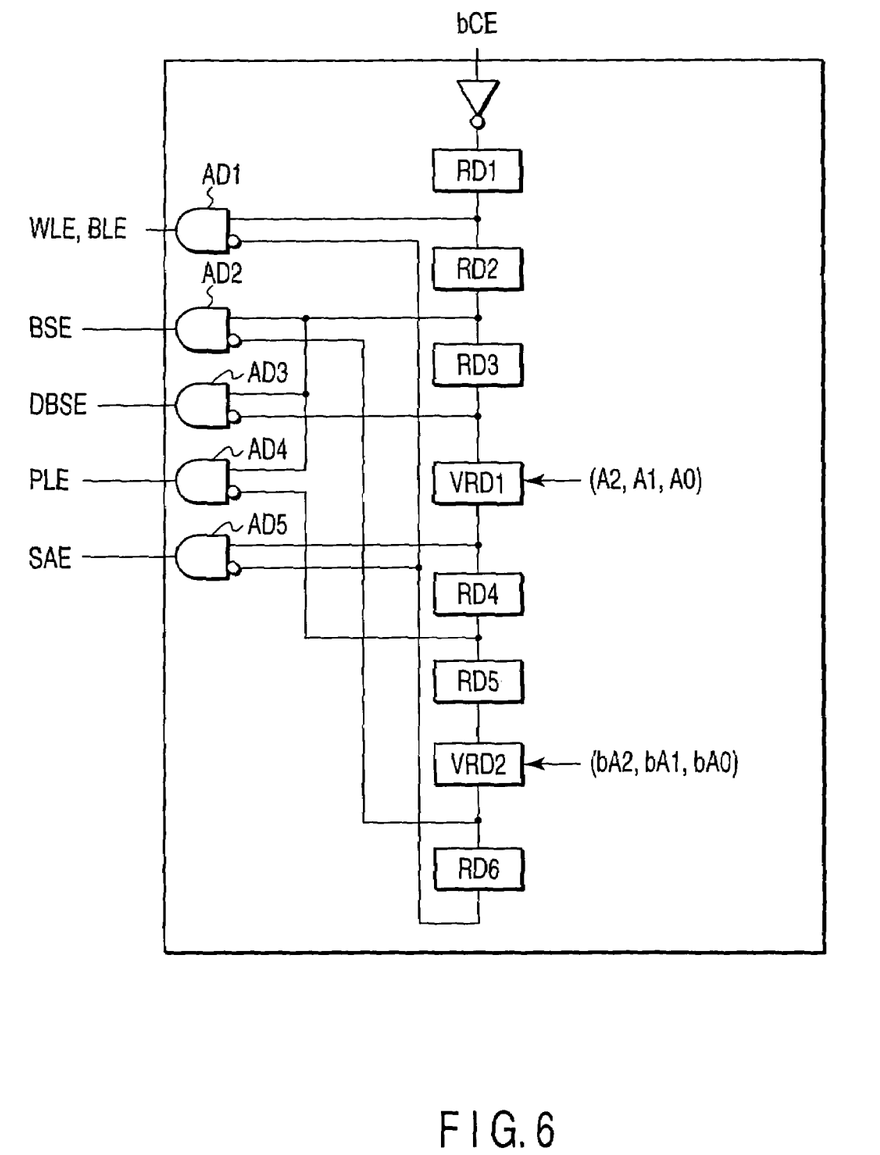
FIG. 6 is a circuit diagram showing an enable signal generating circuit of a first embodiment of the present invention.

FIG. 6 shows an example of the enable signal generating circuit.

RD1 to RD6 denote delay circuits which supply an input signal IN with a predetermined delay amount only when the input signal IN changes from "L" to "H" and outputs an output signal OUT. All the delay times of the delay circuits RD1 to RD6 never become equal and are different from one another.

VRD1 and VRD2 denote delay circuits which supply an input signal IN with a delay amount (different depending on position) corresponding to the position of a selected unit cell (word line) and outputs the obtained signal as an output signal OUT.

An AND circuit AD1 controls the rise-up timing ("L"→"H") and fall timing ("H"→"L") of the word line driver/low decoder/enable signal WLE and bit line/enable signal BLE.

That is, if a chip enable signal CE changes from "L" to "H", after the delay time of the delay circuit RD1 elapses, the word line driver/low decoder/enable signal WLE and bit line/enable signal BLE change from "L" to "H". Thereafter, if total delay time of a delay time by the delay circuits RD2 to RD6 and a delay time set by the delay circuits VRD1, VRD2 elapse, the word line driver/low decoder/enable signal WLE and bit line/enable signal BLE change from "H" to "L".

An AND circuit AD2 controls the rise-up timing ("L"→"H") and fall timing ("H"→"L") of the block selector decoder/enable signal BSE.

That is, if the chip enable signal CE changes from "L" to "H", after the delay time of the delay circuits RD1, RD2 elapse, the block selector decoder/enable signal BSE changes from "L" to "H". Thereafter, if the total delay time of a delay time of the delay circuits RD3, RD4, RD5 and a delay time set by the delay circuits VRD1, VRD2 elapse, the block selector decoder/enable signal BSE changes from "H" to "L".

An AND circuit AD3 controls the rise-up timing ("L"→"H") and the fall timing ("H"→"L") of the DBS decoder/enable signal DBSE.

That is, if the chip enable signal CE changes from "L" to "H", after the delay times of the delay circuits RD1, RD2 elapse, the DBS decoder/enable signal DBSE changes from "L" to "H". Thereafter, if the delay time of the delay circuit RD3 elapses, the DBS decoder/enable signal DBSE changes from "H" to "L".

An AND circuit AD4 controls the rise-up timing ("L"→"H") and the fall timing ("H"→"L") of the plate line driver/enable signal PLE.

That is, if the chip enable signal CE changes from "L" to "H", after the delay times of the delay circuits RD1, RD2 elapse, the plate line driver/enable signal PLE changes from "L" to "H". Further, if the total delay time of delay times of the delay circuits RD3, RD4 and a delay time set by the delay circuit VRD1 elapse, the plate line driver/enable signal PLE changes from "H" to "L".

An AND circuit AD5 controls the rise-up timing ("L"→"H") and the fall timing ("H"→"L") of the sense amplifier enable signal SAE.

That is, if the chip enable signal CE changes from "L" to "H", after the total delay time of delay times of the delay circuits RD1, RD2, RD3 and delay time set by the delay circuit VRD1 elapse, the sense amplifier enable signal SAE changes from "L" to "H". Further, if the total delay time of delay times of the delay circuits RD4, RD5, RD6 and delay time set by the delay circuit VRD2 elapse, the sense amplifier enable signal SAE changes from "H" to "L".

3-bit address signals A2, A1, A0 is used for selecting one (one word line WLi (selected)) of eight unit cells (eight word lines WL1, WL2, . . . WL7) in the cell block. That is, by inputting the address signals A2, A1, A0 into the delay circuits VRD1, VRD2, the delay amounts of the delay circuits VRD1, VRD2 are changed depending on the position a selected unit cell objective for data read within the cell block of, so that the timing at the time of data read can be changed depending on the position of the selected unit cell.

In the meantime, bcE, bA2, bA1, bA0 are inversion signals of CE, A2, A1, A0.

<3> Delay Circuit VRD1, VRD2

Figure 7:
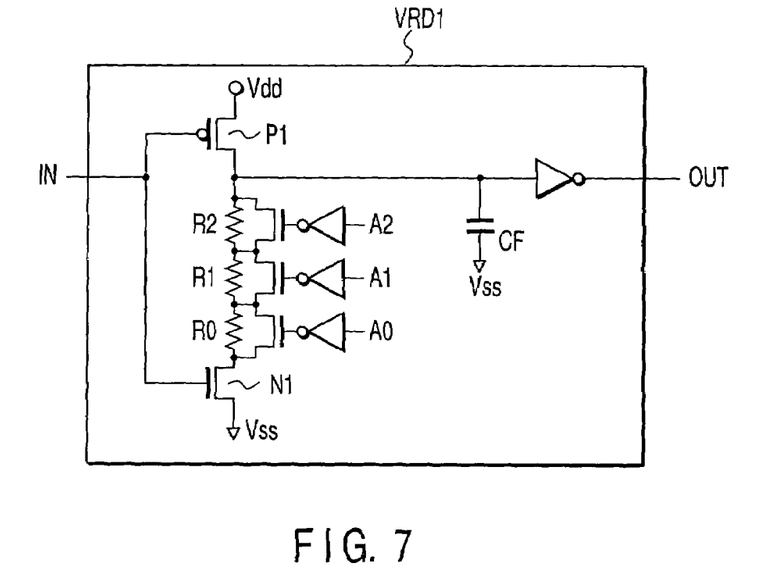
FIG. 7 is a circuit diagram showing an example of a delay circuit VRD1.
Figure 8:
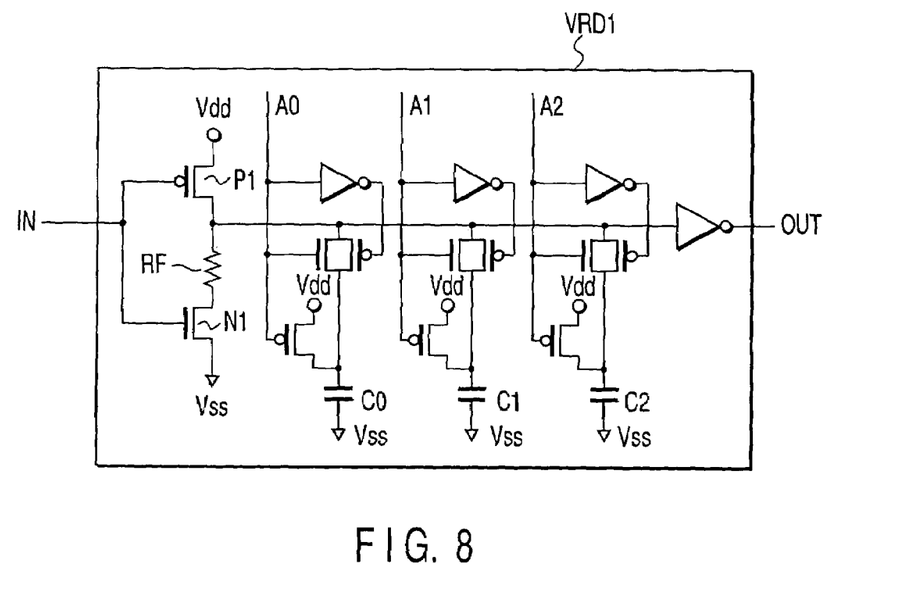
FIG. 8 is a circuit diagram showing an example of the delay circuit VRD1.

FIGS. 7 and 8 show structural examples of the delay circuit VRD1.

Of eight unit cells (eight word lines) within the cell block, a unit cell objective for data read is selected from the address signals A2, A1, A0. Then, the delay amount of the delay circuit VRD1 is determined depending on the position of a selected unit cell.

Figure 9:
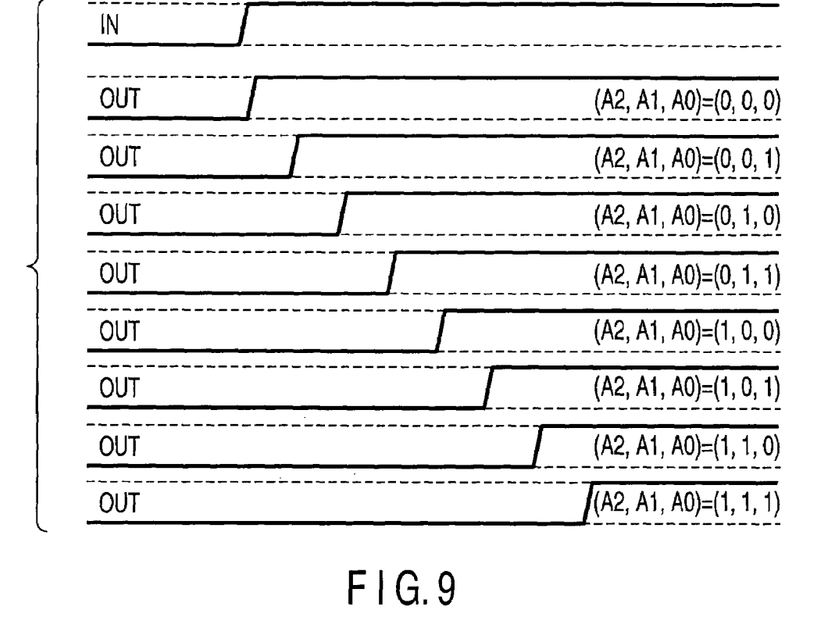
FIG. 9 is a waveform diagram showing the operation of the delay circuit VRD1.

Assuming that when (A2, A1, A0)=(0, 0, 0), the unit cell M0 (see FIG. 5) nearest the bit line BL or the reference bit line Ref.BL is selected, the delay amount at this time is minimized as shown in FIG. 9 to improve cycle time.

Further, assuming that when (A2, A1, A0)=(1, 1, 1), the unit cell M7 (see FIG. 5) nearest the plate line PL0, PL1 is selected, the delay amount at this time is maximized as shown in FIG. 9.

According to the example shown in FIG. 7, the delay amount is controlled by changing the resistance values of resistors R1, R2, R3 within the delay circuit VRD depending on a position of a unit cell to be selected. Here, it is assumed that the resistance values of the resistors R1, R2, R3 has the relationship of r2=2r1=4r0. r1, r2 and r3 are resistance values of the resistors R1, R2, R3.

According to the example shown in FIG. 8, the delay amount is controlled by changing the capacities of capacitors C1, C2, C3 within the delay circuit VRD1 depending on a position of a unit cell to be selected. Assume that the capacities of the capacitors C1, C2, C3 have the relationship of c2=2c1=4c0. c1, c2 and c3 are capacities of the capacitors C1, C2, C3.

Figure 10:
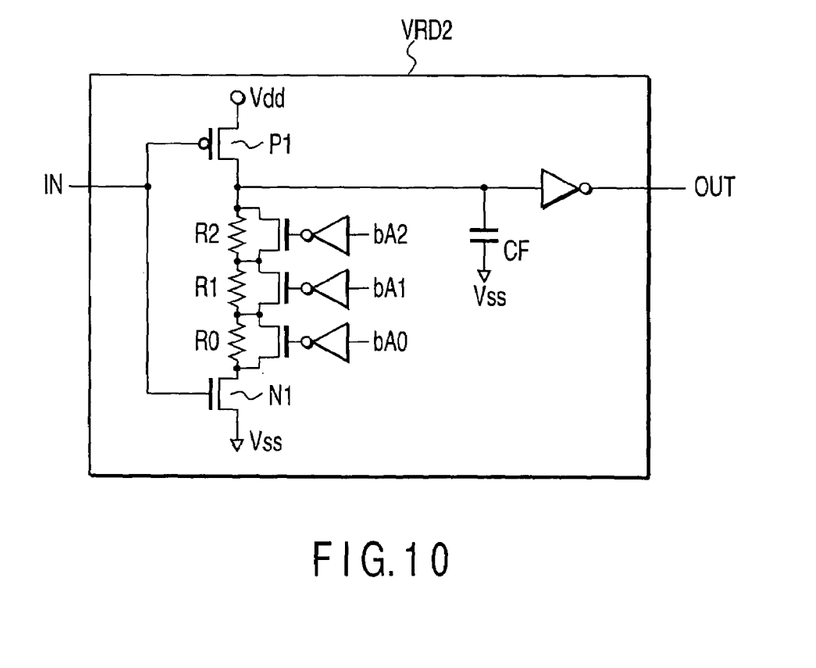
FIG. 10 is a circuit diagram showing an example of a delay circuit VRD2.
Figure 11:
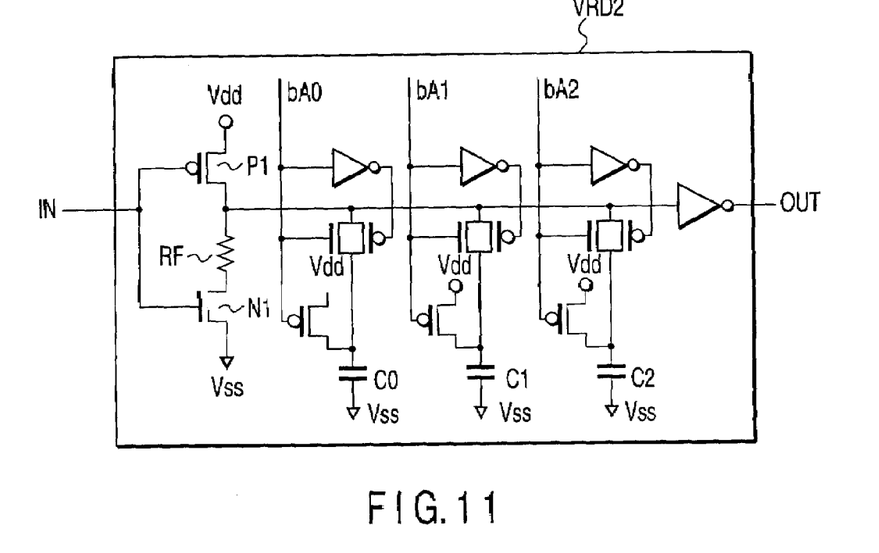
FIG. 11 is a circuit diagram showing an example of the delay circuit VRD2.

FIGS. 10 and 11 show examples of the structures of the delay circuit VRD2.

As described above, of eight unit cells (eight word lines) within the cell block, a unit cell objective for data read is selected by the address signals A2, A1, A0.

Then, to determine the delay amount of the delay circuit VRD2 depending on the position of the selected unit cell, inverted signals bA2, bA1, bA0 of the address signals A2, A1, A0 are used.

Figure 12:
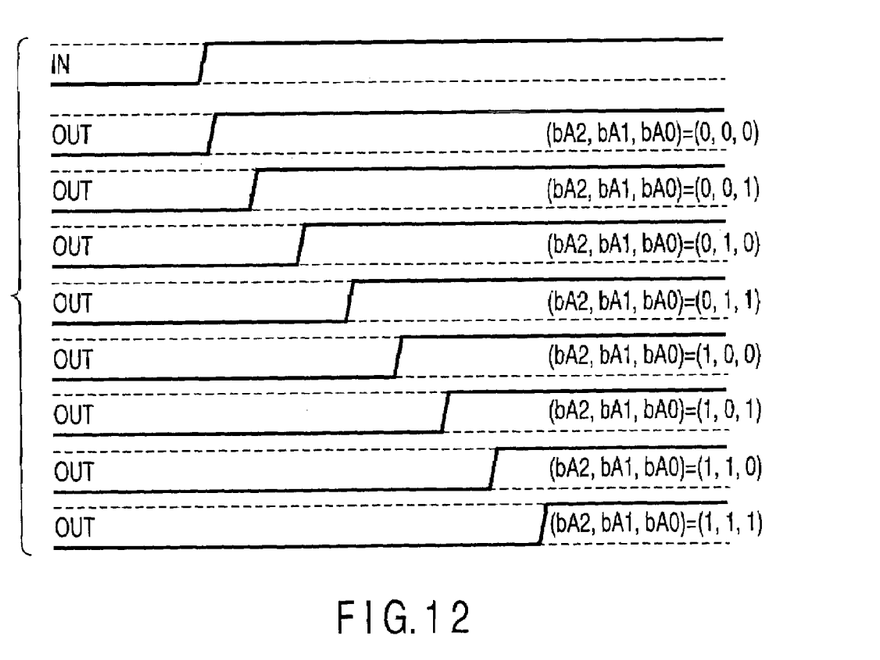
FIG. 12 is a waveform diagram showing the operation of the delay circuit VRD2.

For example, assuming that when (bA2, bA1, bA0)=(1, 1, 1), the unit cell M0 (see FIG. 5) nearest the bit line BL or the reference bit line Ref.BL is selected, the delay amount at this time is maximized as shown in FIG. 12.

Further, assuming that when (bA2, aA1, bA0)=(0, 0, 0), the unit cell M7 (see FIG. 5) nearest the plate lines PL0, PL1 is selected, the delay amount at this time is minimized as shown in FIG. 12 to improve the cycle time.

In the example shown in FIG. 10, the delay amount is controlled by changing the resistance values of the resistors R1, R2, R3 within the delay circuit VRD1 depending on the position of a unit cell to be selected like the example of FIG. 7.

Further, in the example shown in FIG. 11, the delay amount is controlled by changing the capacities of the capacitors C1, C2, C3 within the delay circuit VRD1 depending on the position of a unit cell to be selected like the example of FIG. 8.

<4> Basic Operation Timing

Figure 13:
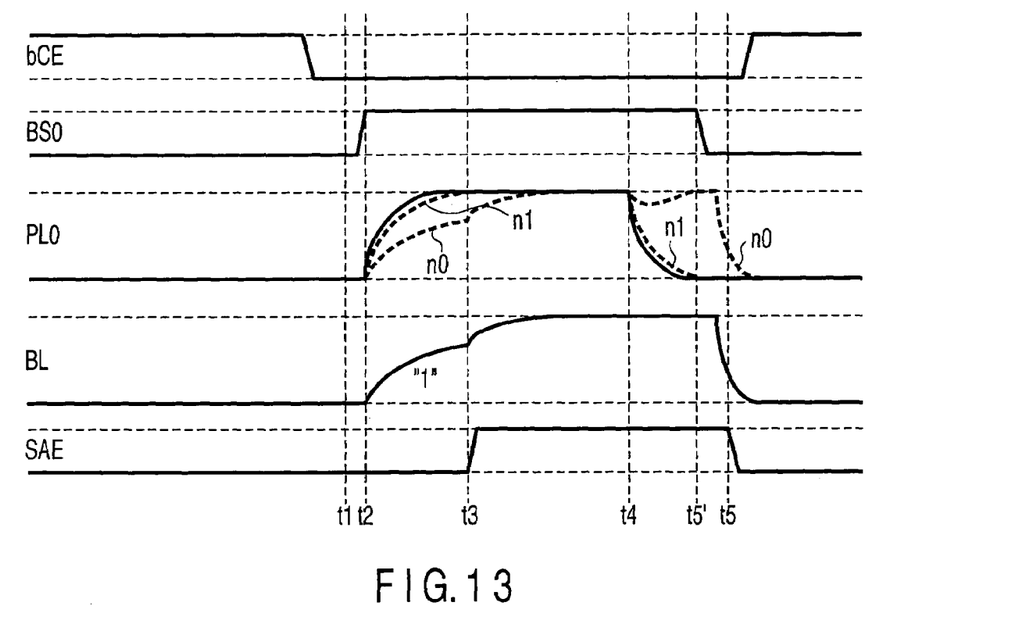
FIG. 13 is a waveform diagram showing the operation of a ferroelectric memory according to the first embodiment.
Figure 14:
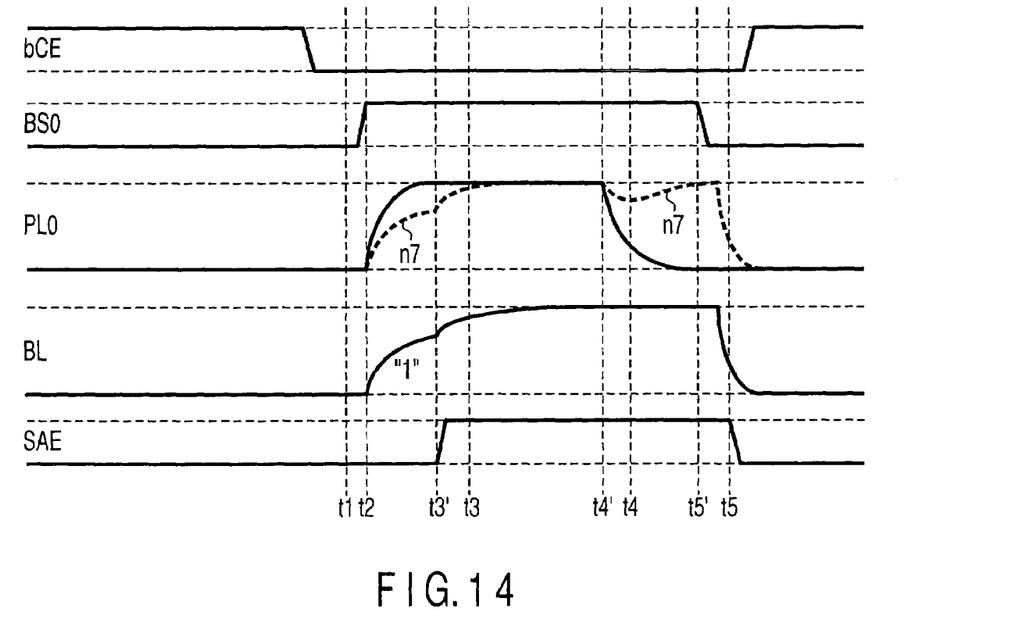
FIG. 14 is a waveform diagram showing the operation of the ferroelectric memory according to the first embodiment.

FIGS. 13 and 14 indicate the basic operation timing of the series connected TC unit type ferroelectric RAM according to a first embodiment of the invention at the time of data read.

Prior to data read, that is, in the period on the left side to time t1 (initial condition), all the word lines are set to "H" and the block selecting signals BS0, BS1 are set to "L" while the plate lines PL0, PL1 are set to "L".

If the chip enable signal CE turns to "H" (bCE is "L"), memory access starts.

First, at time t1, the selected word line changes to "L". Thereafter, in a period of time t1 to t2, the block selection signal BS0 of the selected cell block turns to "H".

Consequently, in a period of time t2 to t3 (t3'), the bit line BL is electrically connected to the selected cell block and changes to a potential corresponding to data stored in the selected unit cell. Additionally, at this time, the plate line PL0 changes to "H".

The time t2 to t3 (t3') is a period for changing the plate line PL0 from "L" to "H" and this period is changed depending on the position of the selected unit cell, that is, the position of the selected word line. More specifically, the nearer the bit line the selected word line is, the longer this period is.

Because the example of FIG. 13 presumes a case where a word line (WL0 in FIG. 5) nearest the bit line is selected, the period of time t2 to t3 is the longest. n0, n1 in the same figure mean nodes n0, n1 within the unit cell in FIG. 5.

Thus, according to the example of FIG. 13, after the period for turning the plate line PL0 to "H" is secured sufficiently, the sense amplifier enable signal SAE is turned to "H" at time t3 so as to activate the sense amplifier. Consequently, a difference between the potential of the bit line BL and the potential of the reference bit line is amplified.

On the other hand, because the example of FIG. 14 presumes a case where a word line (WL7 in FIG. 5) nearest the plate line is selected, the period of time t2 to t3' (before time t3) is the shortest. Here, in the same figure, n7 means a node n7 within the unit cell in FIG. 5.

Therefore, in the example of FIG. 14, the sense amplifier enable signal SAE is turned to "H" at time t3' so as to operate the sense amplifier, thereby improving the cycle time of data read. Consequently, the difference between the potential of the bit line BL and the potential of the reference bit line is amplified.

Because in the examples of FIGS. 13 and 14, the read data is "1", the potential of the bit line BL turns to "H".

Thereafter, a case where the selected unit cell data is "0" in the period of time t3 to t4 (FIG. 13) or period of time t3' to t4' (FIG. 14) is considered and rewriting of "0" data into the selected unit cell is carried out.

In the meantime, the period of t3 to t4 (FIG. 13) is of an equal length to the period of t3' to t4' (FIG. 14).

Thereafter, the plate line PL0 is changed to "L" at time t4 (FIG. 13) or time t4' (FIG. 14) and rewriting of "1" data is carried out for a case where data of the selected unit cell is "1".

The period for rewriting of the "1" data is changed depending on the position of the selected unit cell or the position of the selected word line. More specifically, the nearer the plate line the selected word line is, the longer this period is.

Because the example of FIG. 13 presumes a case where a word line (WL0 in FIG. 5) nearest the bit line is selected, the period for rewriting of the "1" data is adjusted to be the shortest, that is, a period from time t4 to time t5'. Here, in the same figure, n0, n1 mean nodes n0, n1 within the unit cell in FIG. 5.

Therefore, in the example of FIG. 13, the block selection signal BS0 is changed to "L" at time t5' (before time t5).

On the other hand, because it is presumed that the word line (WL7 in FIG. 5) nearest the plate line is selected, the period for rewriting of "1" data is made the longest, that is, a period from t4' to time t5'. Here, in the same figure, n7 means a node n7 within the unit cell in FIG. 5.

Therefore, in the example of FIG. 14, the block selection signal BS0 is changed to "L" at time t5'.

Time t5 indicates a time for changing the block selection signal BS0 to "L" in a conventional data system (data read timing presuming the worst case) (see FIGS. 3 and 4).

Finally, the levels of all the signal lines are returned to the initial condition, that is, the same condition as the period on the left side to the time t1 and then, the data read is terminated.

In this way, the series connected TC unit type ferroelectric RAM of the present invention makes different a time until the plate line is turned to "H" and a time necessary for rewriting of "1" data depending on the position of the selected cell unit (word line) while setting them to optimum times, thereby leading to reduction in the cycle time for data read.

That is, because conventionally, the worse case is presumed, the time until the plate line is turned to "H" and the time necessary for rewriting of "1" data are maximized. Thus, the cycle time of data read is, for example, a period of t1 to t5 in FIGS. 13 and 14.

Contrary to this, according to the present invention, if a word line (WL0 in FIG. 5) nearest the bit line is selected, a sufficient long time t2 to t3 needs to be secured as a period for turning the plate line to "H" as shown in FIG. 13. However, on the other hand, the purpose can be satisfied if a sufficiently short time t4 to t5' (<t4 to t5) is secured complementarily as a period necessary for rewriting of "1" data.

Further, if a word line (WL7 in FIG. 5) nearest the plate line is selected, a sufficiently long time t4 to t5 needs to be secured as a period necessary for rewriting of "1" data as shown in FIG. 14. However, the purpose can be satisfied if a sufficiently short time t2 to t3' (<t2 to t3) is secured complementarily as a period necessary for turning the plate line to "H".

<5> Conclusion

According to the first embodiment, by complementarily changing the time until the plate line is turned to "H" and the time necessary for rewriting of "1" data depending on the position of a unit cell objective for data read, entirely, the cycle time for data read can be reduced.

(2) Second Embodiment

A second embodiment of the invention concerns a ferroelectric memory corresponding to the specification under which after a chip enable signal CE rises (after changing to "L"), that is, after its inversion signal bCE rises (after changing to "H"), various kinds of operations such as rewriting of "1" data is executed.

<1> Memory Cell Array

The example of the configuration of the memory cell array is as shown in FIG. 5 like the first embodiment and therefore, description thereof is omitted.

<2> Enable Signal Generating Circuit

Figure 15:
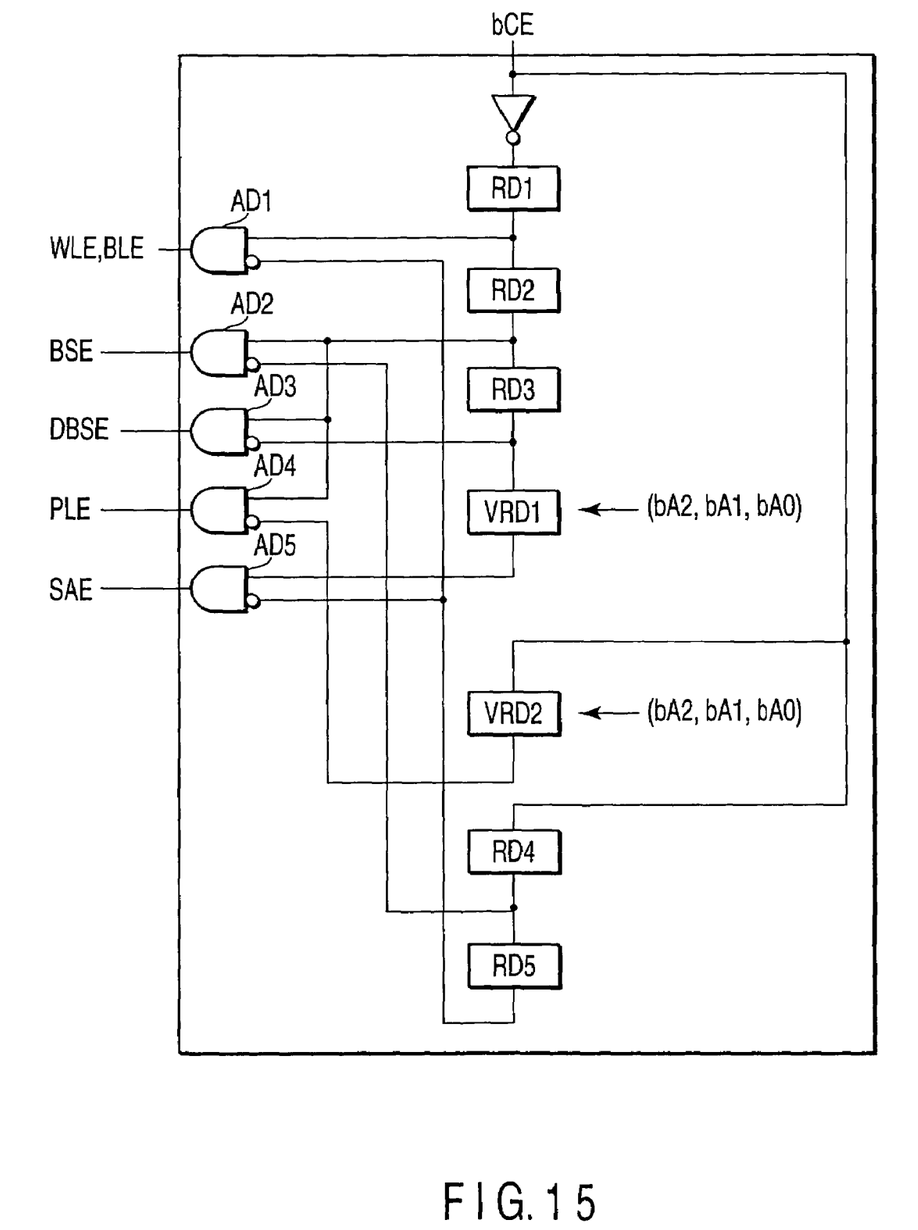
FIG. 15 is a circuit diagram showing an enable signal generating circuit according to a second embodiment of the present invention.

FIG. 15 shows an example of the enable signal generating circuit.

RD1 to RD5 denote delay circuits which supply an input signal IN with a predetermined delay amount only when the input signal IN changes from "L" to "H" and outputs the obtained signal as an output signal OUT. All the delay times of the delay circuits RD1 to RD5 never become equal and are different from each other.

VRD1, VRD2 denote delay circuits which supply an input signal IN with a delay amount (different depending on position) corresponding to the position of a unit cell to be selected (word line) and outputs the obtained signal as an output signal OUT.

An AND circuit AD1 controls the rise-up timing ("L"→"H") and fall timing ("H"→"L") of the word line driver/low decoder/enable signal WLE and bit line/enable signal BLE.

That is, if the chip enable signal CE changes from "L" to "H", after the delay times of the delay circuits RD4, RD5 elapse, the word line driver/low decoder/enable signal WLE and bit line/enable signal BLE change from "L" to "H". Thereafter, if the chip enable signal CE changes from "H" to "L", after the delay time of the delay circuit RD1 elapses, the word line driver/low decoder/enable signal WLE and the bit line/enable signal BLE change from "H" to "L".

An AND circuit AD2 controls the rise-up timing ("L"→"H") and fall timing ("H"→"L") of the block selector decoder/enable signal BSE.

That is, if the chip enable signal CE changes from "L" to "H", after the delay times of the delay circuits RD1, RD2 elapse, the block selector decoder/enable signal BSE changes from "L" to "H". Thereafter, if the chip enable signal CE changes from "H" to "L", after the delay time of the delay circuit RD4 elapses, the block selector/enable signal BSE changes from "H" to "L".

An AND circuit AD3 controls the rise-up timing ("L"→"H") and the fall timing ("H"→"L") of the DBS decoder/enable signal DBSE.

That is, if the chip enable signal CE changes from "L" to "H", after the delay times of the delay circuits RD1, RD2 elapse, the DBS decoder/enable signal DBSE changes from "L" to "H". Thereafter, if the delay time of the delay circuit RD3 elapses, the DBS decoder/enable signal DBSE changes from "H" to "L".

An AND circuit AD4 controls the rise-up timing ("L"→"H") and the fall timing ("H"→"L") of the plate line driver/enable signal PLE.

That is, if the chip enable signal CE changes from "L" to "H", after any longer time of delay time of the delay circuits RD1, RD1 and delay time set up by the delay circuit VRD2 elapses, the plate line driver/enable signal PLE changes from "L" to "H". Thereafter, if the chip enable signal CE changes from "H" to "L", after any shorter time of delay times of the delay circuits RD1, RD2 and delay time set up by the delay circuit VRD2 elapses, the plate line driver/enable signal PLE changes from "H" to "L".

An AND circuit AD5 controls the rise-up timing ("L"→"H") and the fall timing ("H"→"L") of the sense amplifier enable signal SAE.

That is, if the chip enable signal CE changes from "L" to "H", after the total delay time of delay times of the delay circuits RD1, RD2, RD3 and delay time set by the delay circuit VRD1 elapse, the sense amplifier enable signal SAE changes from "L" to "H". Thereafter, if the chip enable signal CE changes from "H" to "L", after the delay times of the delay circuits RD4, RD5 elapse, the sense amplifier enable signal SAE changes from "H" to "L".

<3> Delay Circuits VRD1, VRD2

Because the example of the configuration of the delay circuits VRD1, VRD2 is as shown in FIGS. 7 to 12 like the first embodiment, description thereof is omitted.

<4> Basic Operation Timing

Figure 16:
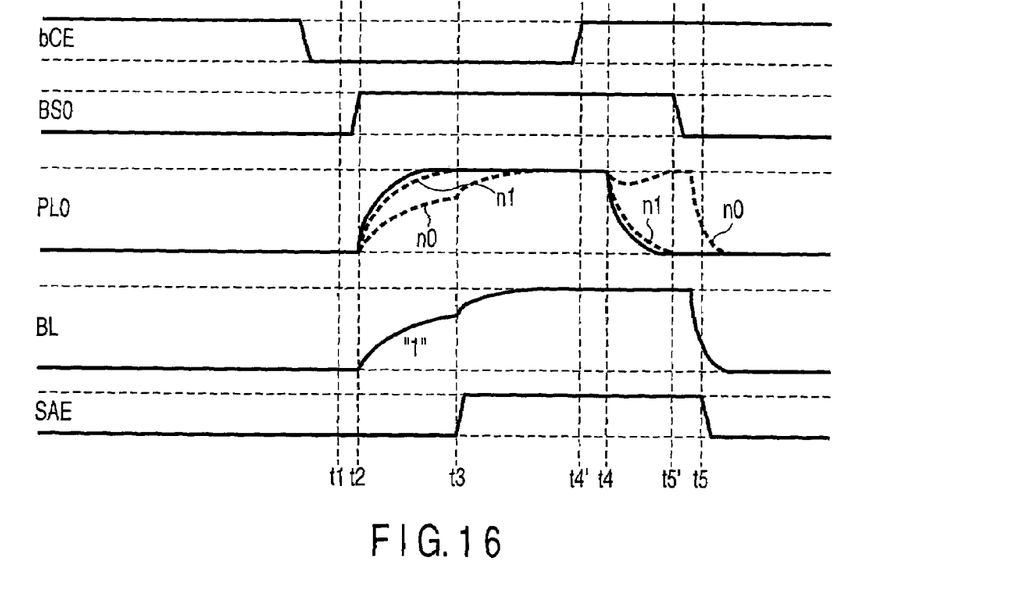
FIG. 16 is a waveform diagram showing the operation of a ferroelectric memory according to the second embodiment.
Figure 17:
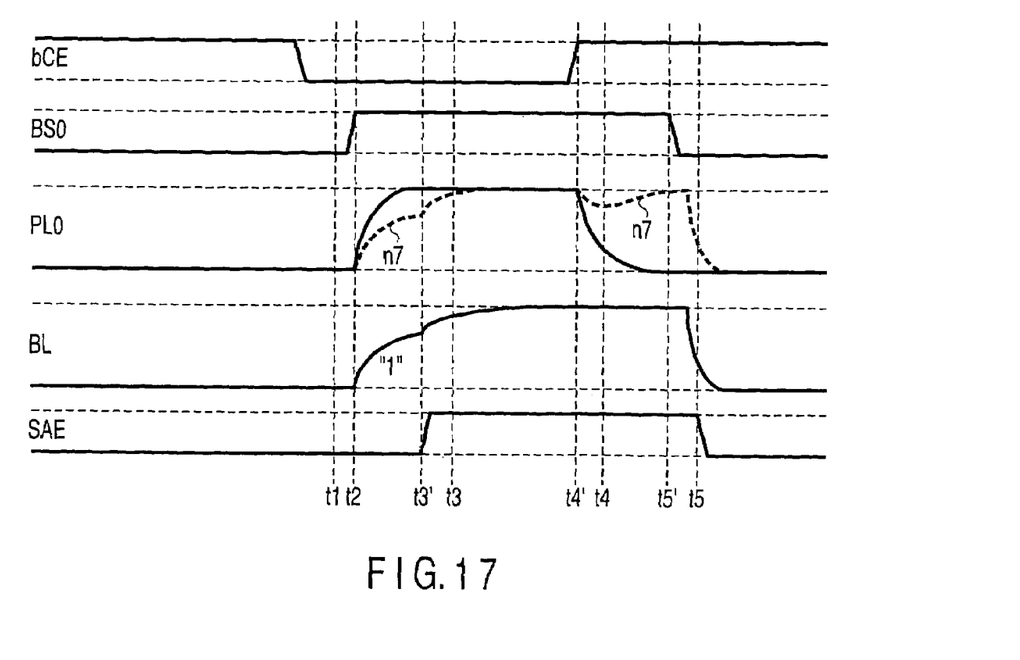
FIG. 17 is a waveform diagram showing the operation of the ferroelectric memory according to the second embodiment.

FIGS. 16 and 17 indicate the basic operation timing of the series connected TC unit type ferroelectric RAM according to the second embodiment at the time of data read.

Prior to data read, that is, in the period on the left side to time t1 (initial condition), all the word lines are set to "H" and the block selecting signals BS0, BS1 are set to "L" while the plate lines PL0, PL1 are set to "L".

If the chip enable signal CE turns to "H" (bCE is "L"), memory access starts.

First, at time t1, the selected word line changes to "L". Thereafter, in a period of time t1 to t2, the block selection signal BS0 of the selected cell block turns to "H".

Consequently, in a period of time t2 to t3 (t3'), the bit line BL is electrically connected to the selected cell block and changes to a potential corresponding to data stored in the selected unit cell. Additionally, at this time, the plate line PL0 changes to "H".

The time t2 to t3 (t3') is a period for changing the plate line PL0 from "L" to "H" and this period is changed depending on the position of the selected unit cell, that is, the position of the selected word line. More specifically, the nearer the bit line the selected word line is, the longer this period is.

Because the case of FIG. 16 presumes a case where a word line (WL0 in FIG. 5) nearest the bit line is selected, the period of time t2 to t3 is the longest. Here, n0, n1 in the same figure mean nodes n0, n1 within the unit cell in FIG. 5.

Thus, according to the example of FIG. 16, after a sufficient period for turning the plate line PL0 to "H" is secured, the sense amplification signal SAE is turned to "H" at time t3 and the sense amplifier is activated. Consequently, the difference between the potential of the bit line BL and the potential of the reference bit line is amplified.

On the other hand, because the example of FIG. 17 presumes a case where a word line (WL7 in FIG. 5) nearest the plate line is selected, the period of time t2 to t3' (before time t3) is the shortest. Here, n7 in the same figure means a node n7 in the unit cell.

Thus, according to the example of FIG. 17, the sense amplifier enable signal SAE is turned to "H" at time t3' so as to activate the sense amplifier thereby improving the cycle time of data read. Consequently, the difference between the potential of the bit line BL and the potential of the reference bit line is amplified.

Because according to the example of FIGS. 16 and 17, read data is "1", the potential of the bit line BL is "H".

By considering a case where selected unit cell data is "0" in the period of time t3 to t4 (FIG. 16) or period of time t3' to t4' (FIG. 17), rewriting of "0" data into the selected unit cell is carried out.

Meanwhile, the period of time t3 to t4 is of the same length as the period of time t3' to t4'.

According to this embodiment, at time t4' before the time t4, the chip enable signal CE is turned to "L" (bCE is turned to "H").

Corresponding to a change in the chip enable signal CE, rewriting of "1" data for a case where the selected unit cell data is "1" is carried out.

That is, at time t4 (FIG. 16) or time t4' (FIG. 17), the plate line PL0 is changed to "L" and rewriting of "1" data is executed.

The period for rewriting of "1" data is changed depending on the position of the selected unit cell, that is, the position of the selected word line. More specifically, the nearer the plate line the selected word line is, the longer this period is.

Because the example of FIG. 16 presumes a case where a word line (WL0 in FIG. 5) nearest the bit line is selected, the period for rewriting "1" data is made the shortest, that is, to be a period of time t4 to time t5'. Here, n0, n1 in the same figure mean nodes n0, n1 within the unit cell in FIG. 5.

Thus, according to the example of FIG. 16, at time t5' (before time t5), the block selection signal BS0 is changed to "L".

On the other hand, because the example of FIG. 17 presumes a case where a word line (WL7 in FIG. 5) nearest the plate line is selected, the period for rewriting "1" data is made the longest, that is, to be a period of time t4' to time t5'. Here, n7 in the same figure means a node n7 within the unit cell in FIG. 5.

Therefore, according to the example of FIG. 17, at time t5', the block selection signal BS0 is changed to "L".

In the meantime, time t5 indicates a time when the block selection signal BS0 is changed to "L" in the conventional data system (data read timing presuming the worst case) (see FIGS. 3 and 4).

Finally the levels of all the signal lines are returned to the initial condition, that is, the same condition as the period on the left side to the time t1 and then, the data read is terminated.

In this way, the series connected TC unit type ferroelectric RAM of the present invention makes different a time until the plate line is turned to "H" and a time necessary for rewriting of "1" data depending on the position of the selected cell unit (word line) while setting them to optimum times, thereby leading to reduction in the cycle time for data read.

That is, because conventionally, the worse case is presumed, the time until the plate line is turned to "H" and the time necessary for rewriting of "1" data are maximized. Thus, the cycle time of data read is, for example, a period of t1 to t5 in FIGS. 16 and 17.

Contrary to this, according to the present invention, if the word line nearest the bit line is selected, a sufficient long time t2 to t3 needs to be secured as a period for turning the plate line to "H" as shown in FIG. 13. However, on the other hand, the purpose can be satisfied if a sufficiently short time t4 to t5' (<t4 to t5) is secured complementarily as a period necessary for rewriting of "1" data.

Further, if a word line (WL7 in FIG. 5) nearest the plate line is selected, a sufficiently long time t4 to t5 needs to be secured as a period necessary for rewriting of "1" data as shown in FIG. 17. However, the purpose can be satisfied if a sufficiently short time t2 to t3' (<t2 to t3) is secured complementarily as a period necessary for turning the plate line to "H".

<5> Conclusion

According to the second embodiment as well, by changing the time until the plate line is turned to "H" and the time necessary for rewriting of "1" data complementarily depending on the position of a unit cell objective for data read, entirely, the cycle time for data read can be reduced.

4. Others

According to the present embodiments, by changing the control timing of data read corresponding to the position of a unit cell within the cell block, the cycle time of the data read in the series connected TC unit type ferroelectric RAM can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:
   a cell block having a plurality of unit cells connected in series, one end of the cell block being connected to a plate line and the other end of the cell block being connected to a bit line through a block selecting transistor;
   a sense amplifier connected to the bit line;
   a block selector decoder which controls ON/OFF of the block selecting transistor; and
   an enable signal generating circuit which controls timing for operating the sense amplifier and the block selector decoder,
   wherein each of said plurality of unit cells has a structure in which a ferroelectric capacitor and a cell transistor are connected in parallel,
   the enable signal generating circuit changes the timing for operating the sense amplifier and the block selector decoder depending on a position of a selected unit cell objective for data read of said plurality of unit cells, and
   wherein the period until the sense amplifier is operated since the level of the plate line is changed depending on the position of the selected unit cell and the period until the block selecting transistor is turned off since the level of the plate line is changed change complementarily.

2. The ferroelectric memory according to claim 1, wherein the period until the sense amplifier is operated since the level of the plate line is changed differs depending on the position of the selected unit cell.

3. The ferroelectric memory according to claim 2, wherein the period until the sense amplifier is operated since the level of the plate line is changed is set to be shorter for a unit cell disposed at a position nearer the plate line.

4. The ferroelectric memory according to claim 2, wherein the period until the sense amplifier is operated since the level of the plate line is changed is set to be the shortest for a unit cell disposed at a position nearest the plate line, while the longest for a unit cell disposed at a position nearest the bit line.

5. The ferroelectric memory according to claim 1, wherein the period until the block selecting transistor is turned off since the level of the plate line is changed differs depending on the position of the selected unit cell.

6. The ferroelectric memory according to claim 5, wherein the period until the block selecting transistor is turned off since the level of the plate line is changed is set to be shorter for a unit cell disposed at a position nearer the bit line.

7. The ferroelectric memory according to claim 5, wherein the period until the block selecting transistor is turned off since the level of the plate line is changed is set to be the shortest for a unit cell disposed at a position nearest the bit line, while the longest for a unit cell disposed at a position nearest the plate line.

8. The ferroelectric memory according to claim 1, wherein the cycle times for data read of said plurality of unit cells are equal.

9. The ferroelectric memory according to claim 1, wherein the period until the level of the plate line is changed since the level of a chip enable signal is changed differs depending on the position of the selected unit cell.

10. The ferroelectric memory according to claim 9, wherein the period until the level of the plate line is changed since the level of the chip enable signal is changed is set to be shorter for a unit cell disposed at a position nearer the plate line.

11. The ferroelectric memory according to claim 9, wherein the period until the level of the plate line is changed since the level of the chip enable signal is changed is set to be the shortest for a unit cell disposed at a position nearest the plate line, while the longest for a unit cell disposed at a position nearest the bit line.

12. The ferroelectric memory according to claim 1, wherein the enable signal generating circuit determines the position of the selected unit cell on the basis of an address signal.

13. The ferroelectric memory according to claim 12, wherein the timing for operating the sense amplifier and the block selector decoder is controlled by controlling the delay amount of a delay circuit on the basis of the address signal.

14. A data read method of a ferroelectric memory comprising a cell block having a plurality of unit cells connected in series, and having one end connected to a plate line and another end connected to a bit line through a block select transistor, wherein each of the unit cells has a ferroelectric capacitor and a cell transistor connected in parallel, comprising:
   determining the position of a selected unit cell objective for data read of the plural unit cells on the basis of an address signal;
   changing the timing of the data read depending on the position of the selected unit cell, and
   wherein the period until the sense amplifier is operated since the level of the plate line is changed depending on the position of the selected unit cell and the period until the block selecting transistor which selects the cell block is turned off since the level of the plate line is changed change complementarily.

15. The data read method according to claim 14, wherein the period until the sense amplifier is operated since the level of the plate line is changed is set to be shorter for a unit cell disposed at a position nearer the plate line.

16. The ferroelectric memory according to claim 14, wherein the period until the block selecting transistor which selects the cell block is turned off since the level of the plate line is changed is set to be shorter for a unit cell disposed at a position nearer the bit line.

17. The data read method according to claim 14, wherein the cycle times for data read of said plurality of unit cells are set to be equal.

18. The data read method according to claim 14, wherein the period until the level of the plate line is changed since the level of a chip enable signal is changed is set to be shorter for a unit cell disposed at a position nearer the plate line.

* * * * *